(12) United States Patent
Im et al.

(10) Patent No.: US 8,987,714 B2
(45) Date of Patent: Mar. 24, 2015

(54) ORGANIC LIGHT EMITTING DIODE DISPLAY AND METHOD FOR MANUFACTURING THE SAME

(71) Applicant: Samsung Display Co., Ltd., Yongin-si, Gyeonggi-do (KR)

(72) Inventors: Ja-Hyun Im, Yongin-si (KR); Ji-Hwan Yoon, Yongin-si (KR); Byung-Hoon Chun, Yongin-si (KR); Jung-Min Moon, Yongin-si (KR); Tae-Kwang Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 105 days.

(21) Appl. No.: 13/673,197

(22) Filed: Nov. 9, 2012

(65) Prior Publication Data
US 2013/0207084 A1  Aug. 15, 2013

(30) Foreign Application Priority Data
Feb. 13, 2012  (KR) .................. 10-2012-0014182

(51) Int. Cl.
- H01L 27/00 (2006.01)
- H01L 27/32 (2006.01)
- H01L 51/00 (2006.01)
- H01L 51/50 (2006.01)

(52) U.S. Cl.
CPC ........ *H01L 27/3211* (2013.01); *H01L 51/0001* (2013.01); *H01L 51/506* (2013.01); *H01L 51/5076* (2013.01); *H01L 27/3281* (2013.01); *H01L 2251/558* (2013.01)

USPC .............. 257/40; 257/E27.119; 257/E51.018; 257/E51.019; 257/E51.022

(58) Field of Classification Search
USPC ............. 257/40, E27.119, E51.018, E51.019, 257/E51.022
See application file for complete search history.

(56) References Cited

U.S. PATENT DOCUMENTS

| | | | |
|---|---|---|---|
| 8,314,419 B2* | 11/2012 | Mitsuya et al. | 257/40 |
| 8,368,054 B2* | 2/2013 | Kim et al. | 257/40 |
| 2011/0233604 A1* | 9/2011 | Ikeda | 257/103 |
| 2012/0032155 A1* | 2/2012 | Mitsuya | 257/40 |

FOREIGN PATENT DOCUMENTS

| | | |
|---|---|---|
| KR | 10-0752383 | 8/2007 |
| KR | 10-0932940 | 12/2009 |
| KR | 10-0975867 | 8/2010 |

OTHER PUBLICATIONS

Korean Patent Abstract Publication No. 10-2007-0068147 A, dated Jun. 29, 2007 for corresponding KR 10-0752383 listed above, 1 page.
Korean Patent Abstract Publication No. 10-2009-0123536 a, dated Dec. 2, 2009 for corresponding KR 10-0932940 listed above, 1 page.
Korean Patent Abstract Publication No. 10-2008-0058051 A, dated Jun. 25, 2008 for corresponding KR 10-0975867 listed above, 1 page.

* cited by examiner

*Primary Examiner* — Victor A Mandala
(74) *Attorney, Agent, or Firm* — Christie, Parker & Hale, LLP

(57) ABSTRACT

An organic light emitting diode display includes a p-doped layer that can obtain high efficiency at low-voltage driving and low current and prevent leakage current by differentially forming the p-doped layer for each pixel.

46 Claims, 5 Drawing Sheets

ORGANIC LIGHT EMITTING DIODE DISPLAY AND METHOD FOR MANUFACTURING THE SAME

CROSS-REFERENCE TO RELATED APPLICATIONS

This application claims the benefit of and priority to Korean Patent Application No. 10-2012-0014182, filed on Feb. 13, 2012 in the Korean Intellectual Property Office, the entire content of which is incorporated herein by reference.

TECHNICAL FIELD

The present disclosure relates to an organic light emitting diode display and a method for manufacturing the same.

BACKGROUND

Organic light emitting diode displays are self-luminous display devices that use organic light emitting diodes to emit light to display images. Unlike liquid crystal displays, organic light emitting diode displays do not require separate light sources, and thus, thickness and weight can be reduced. Moreover, organic light emitting diode displays exhibit high quality characteristics such as low power consumption, high luminance, fast response speeds, and the like, and thus are being highlighted as next generation display devices for portable electronic devices.

Various attempts are being made to reduce power consumption and improve efficiency of organic light emitting diode displays. For instance, a material having high charge mobility is used for a hole injection layer, a hole transporting layer, and the like, in order to achieve low voltage, high efficiency, and a long service life.

FIG. 1 schematically illustrates a structure of an organic light emitting diode display capable of being driven at low voltage.

Referring to FIG. 1, the organic light emitting diode display includes first, second and third pixel electrodes as a first electrode 20 on a substrate 10. The first electrode 20 is divided into pixel units by a pixel defining layer (PDL) 30. On the first electrode 20 and the pixel defining layer 30, an interface p-doped layer 41, a hole transporting layer 42, an intermediate p-doped layer 43, and a light emitting layer 50 are formed. In this case, the light emitting layer 50 is divided into a red light emitting layer, a green light emitting layer, and a blue light emitting layer. On the light emitting layer 50, a common electrode is formed as a second electrode 60. A hole injection layer may be additionally disposed between the first electrode 20 and the hole transporting layer 42, or only the hole injection layer (instead of the hole transporting layer 42) may be disposed. In addition, at least one of an electron injection layer and an electron transporting layer may be disposed between the light emitting layer 50 and the second electrode 60.

FIG. 2 schematically illustrates another example of an organic light emitting diode display having a structure including a substrate 10, a first electrode 20, organic layers 41, 42, and 43, a light emitting layer 50, and a second electrode 60. Here, as the organic layers, an interface p-doped layer 41, a hole transporting layer 42, and an intermediate p-doped layer 43 may be disposed. In order to improve the interface characteristics between the materials of the first electrode 20 and the hole transporting layer 42, the interface p-doped layer 41 (partially doped with a p-dopant) is applied to a boundary between the layers. In this case, in order to improve service life and driving voltage, a p-dopant doped region (i.e., the intermediate p-doped layer 43) is additionally disposed on the hole transporting layer 42 as well as the boundary with the first electrode 20. The intermediate p-doped layer 43 is formed as a common layer of a first pixel electrode, a second pixel electrode, and a third pixel electrode together with the interface p-doped layer 41.

However, in the organic light emitting diode display as described above, the intermediate p-doped layer 43 is formed using a material having high charge mobility, and when formed as a common layer, the p-doped layer may become a path for the movement of electric charges (holes). As a result, the p-doped layer 43 may serve as a lateral leakage path through which electric charges can flow into another adjacent pixel while driving any one pixel. In addition, when driving a single color due to lateral leakage current, an adjacent pixel of a different color is also driven, and thus it is difficult to implement the proper color. Further, grays are not smoothly displayed at low luminance, which may lead to color-mixing.

SUMMARY

Embodiments of the present disclosure provide an organic light emitting diode display capable of preventing leakage current while maintaining low-voltage driving and high luminous efficiency by differentially applying an intermediate p-doped layer according to pixels without forming the intermediate p-doped layer as a common layer.

Embodiments of the present disclosure provide a method for manufacturing the organic light emitting diode display.

In an exemplary embodiment of the present disclosure, an organic light emitting diode display includes: a substrate; a plurality of pixel electrodes on the substrate; a first light emitting auxiliary layer on the pixel electrodes; an organic light emitting layer on the first light emitting auxiliary layer; and a common electrode on the organic light emitting layer. The plurality of pixel electrodes includes a first pixel electrode, a second pixel electrode, and a third pixel electrode. The first light emitting auxiliary layer includes a first doped layer, a first buffer layer, and second doped layers. The organic light emitting layer includes a first light emitting layer, a second light emitting layer, and a third light emitting layer. The second doped layers are spaced apart from each other on at least one of the first pixel electrode, the second pixel electrode, and the third pixel electrode.

In another exemplary embodiment of the present disclosure, a method for manufacturing the organic light emitting diode display includes: forming a plurality of pixel electrodes on a substrate; forming a first light emitting auxiliary layer on the pixel electrodes; forming an organic light emitting layer on the first light emitting auxiliary layer; and forming a common electrode on the organic light emitting layer. The forming of the pixel electrodes includes forming a first pixel electrode, a second pixel electrode, and a third pixel electrode. The forming of the first light emitting auxiliary layer includes forming a first doped layer, forming a first buffer layer, and forming second doped layers. The forming of the organic light emitting layer includes forming a first light emitting layer, forming a second light emitting layer, and forming a third light emitting layer. The second doped layers are formed on at least one of the first pixel electrode, the second pixel electrode, and the third pixel electrode.

According to an exemplary embodiment of the present disclosure, the first light emitting auxiliary layer may include at least one of a hole injection layer and a hole transporting layer.

According to an exemplary embodiment of the present disclosure, the first buffer layer may include at least one of a hole injection layer and a hole transporting layer.

According to an exemplary embodiment of the present disclosure, the organic light emitting diode display may further include a second light emitting auxiliary layer between the organic light emitting layer and the common electrode.

According to an exemplary embodiment of the present disclosure, the second light emitting auxiliary layer may include at least one of an electron transporting layer and an electron injection layer.

According to an exemplary embodiment of the present disclosure, the organic light emitting diode display may further include a second buffer layer between the second doped layers and the organic light emitting layer.

According to an exemplary embodiment of the present disclosure, the second buffer layer may include at least one of a hole injection layer and a hole transporting layer.

According to an exemplary embodiment of the present disclosure, the first doped layer may be disposed on the first pixel electrode, the second pixel electrode, and the third pixel electrode.

According to an exemplary embodiment of the present disclosure, the second doped layers may be disposed on the first pixel electrode, the second pixel electrode, and the third pixel electrode.

According to an exemplary embodiment of the present disclosure, a first height of the first buffer layer formed on the first pixel electrode, a second height of the first buffer layer formed on the second pixel electrode, and a third height of the first buffer layer formed on the third pixel electrode may be different from each other.

According to an exemplary embodiment of the present disclosure, the second doped layers may be formed on two of the first pixel electrode, the second pixel electrode, and the third pixel electrode.

According to an exemplary embodiment of the present disclosure, the distances between the first doped layer and the second doped layers may be different from each other.

According to an exemplary embodiment of the present disclosure, the second doped layer may be disposed on one of the first pixel electrode, the second pixel electrode, and the third pixel electrode.

According to an exemplary embodiment of the present disclosure, each of the first light emitting layer, the second light emitting layer, and the third light emitting layer may be any one of a red light emitting layer, a green light emitting layer, or a blue light emitting layer.

According to an exemplary embodiment of the present disclosure, the first doped layer may include a p-doped material.

According to an exemplary embodiment of the present disclosure, a thickness of the first doped layer may be about 10 to about 200 Å.

According to an exemplary embodiment of the present disclosure, the second doped layer may include a p-doped material.

According to another exemplary embodiment of the present disclosure, the second doped layer may include at least one of hexanitrile hexaazatriphenylene, tetrafluoro-tetracyanoquinodimethane (F$_4$-TCNQ), lithium quinolate (LiQ), FeCl$_3$, F$_{16}$CuPc, a compound represented by the following Formula 1, or a metal oxide. Here, the metal oxide may be selected from vanadium oxide (V$_2$O$_5$), rhenium oxide (Re$_2$O$_7$), and indium tin oxide (ITO).

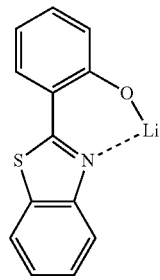

[Formula 1]

According to an exemplary embodiment of the present disclosure, a thickness of the second doped layer may be about 10 to about 200 Å.

According to another exemplary embodiment of the present disclosure, a thickness of the second doped layer may be about 20 to about 80 Å.

According to an exemplary embodiment of the present disclosure, the plurality of pixel electrodes may be divided into pixel units by a pixel defining layer.

According to an exemplary embodiment of the present disclosure, the pixel electrode may be a positive electrode, and the common electrode may be a negative electrode.

According to an exemplary embodiment of the present disclosure, the common electrode may have a light transmitting property.

According to exemplary embodiments of the present disclosure, it is possible to obtain high efficiency even at low driving voltage and low current, and to prevent leakage current at each pixel by differentially introducing a second layer having good hole injection properties for each pixel, thereby smoothly displaying grays at low luminance.

Further, luminous efficiency may be increased by making it possible to emit light at substantially uniform positions of the organic light emitting layers in all the colors of the pixels.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
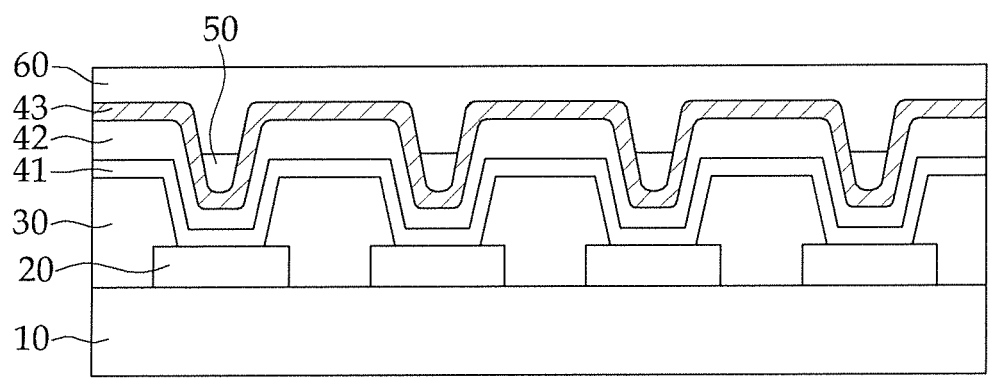
FIGS. 1 and 2 illustrate examples of organic light emitting diode displays according to the related art.
Figure 2:
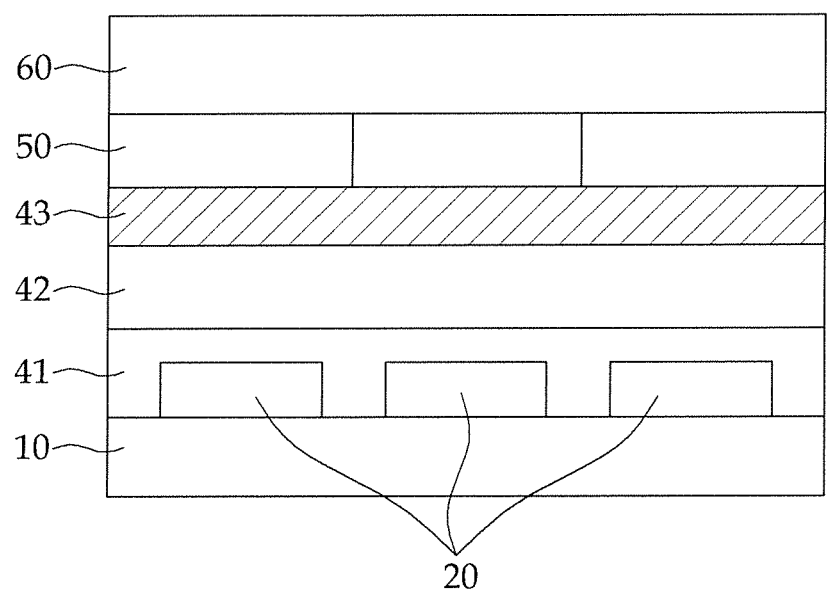

Hereinafter, exemplary embodiments of the present disclosure will be described with reference to the accompanying drawings.

Although certain exemplary embodiments are shown in the drawings and described below, it is understood that the disclosed exemplary embodiments of the present disclosure may be modified in various ways. Accordingly, the scope of the present disclosure is not limited to the specific exemplary embodiments, and should be construed as including all the changes, equivalents, and substitutions included in the spirit and scope of the present disclosure.

Terms used herein are general terms that are known to those of ordinary skill in the art. In some cases, however, terms selected at the applicant's discretion are also used, and for those terms, their meanings should be understood as consistent with the description and use in this detailed description of the present disclosure.

In order to further the understanding of the present disclosure, parts that do not relate to the description are omitted, and like reference numerals designate like elements throughout the specification. Further, in the drawings, the size and the thickness of each element are arbitrarily represented for ease of description, and the present disclosure is not limited to what is shown in the drawings.

In the drawings, the thicknesses of layers, films, panels, regions, etc., are exaggerated for clarity. Further, in the drawings, the thickness of some layers, films, panels, regions, etc., are exaggerated for ease of description. It will be understood that when an element such as a layer, film, region, or substrate is referred to as being "on" another element, it can be directly on the other element or intervening elements may also be present.

Figure 3:
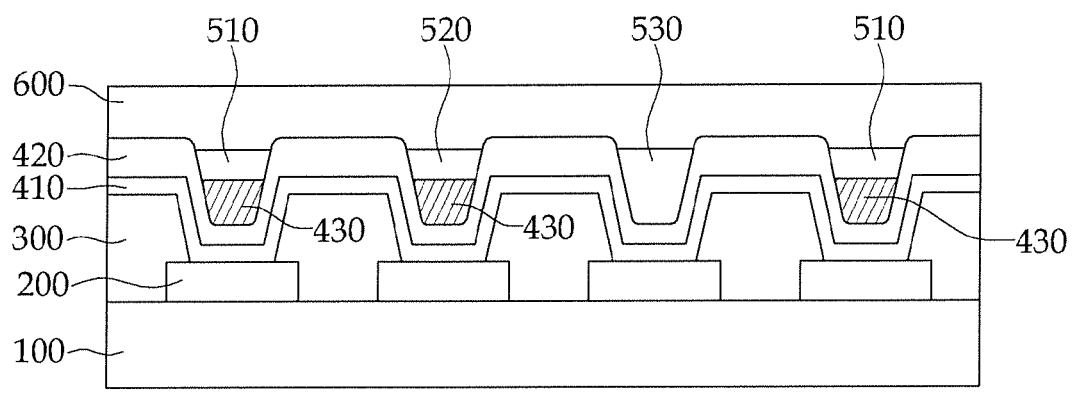
FIG. 3 is a cross-sectional view of an organic light emitting diode display according to an exemplary embodiment of the present disclosure.
Figure 4:
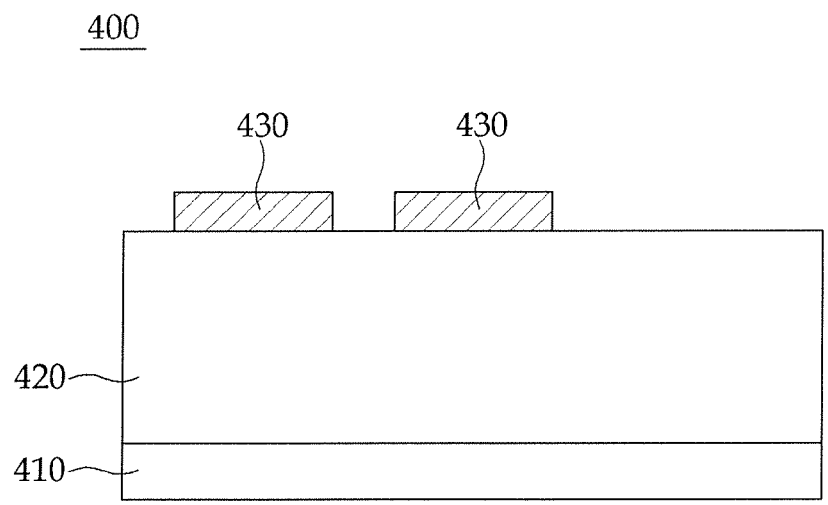
FIG. 4 is a schematic view of a structure of a first light emitting auxiliary layer according to an exemplary embodiment of the present disclosure.

FIGS. 3 and 4 schematically illustrate the structure of an organic light emitting diode display according to an exemplary embodiment of the present disclosure.

Referring to FIG. 3, an organic light emitting diode display according to an exemplary embodiment of the present disclosure includes a substrate 100, a plurality of pixel electrodes 200, a pixel defining layer 300, a first doped layer 410, a first buffer layer 420, and a second doped layer 430 making up a first light emitting auxiliary layer 400, an organic light emitting layer including first, second and third light emitting layers 510, 520, and 530, and a common electrode 600.

The substrate 100 may be made of transparent glass containing $SiO_2$ as a main component. The substrate 100 is not necessarily limited thereto and may also be formed of a plastic material. Further, metal foil or the like may be applied thereto. Although not shown in the figure, the substrate 100 may include at least one thin film transistor or capacitor for driving each pixel, and a circuit for driving the pixel may use the thin film transistor, the capacitor, and the like.

The pixel defining layer 300 is formed on the substrate 100. The pixel defining layer 300 includes a plurality of matrix-shaped openings. The pixel electrodes are exposed in the openings and each pixel is defined according to each opening. In other words, respective pixels are separated from each other by the pixel defining layer 300.

The plurality of pixels may include a first pixel, a second pixel, and a third pixel that emit different colors of lights. In an exemplary embodiment, the first pixel may be an area where red light is emitted, the second pixel may be an area where blue light is emitted, and the third pixel may be an area where green light is emitted.

Figure 5:
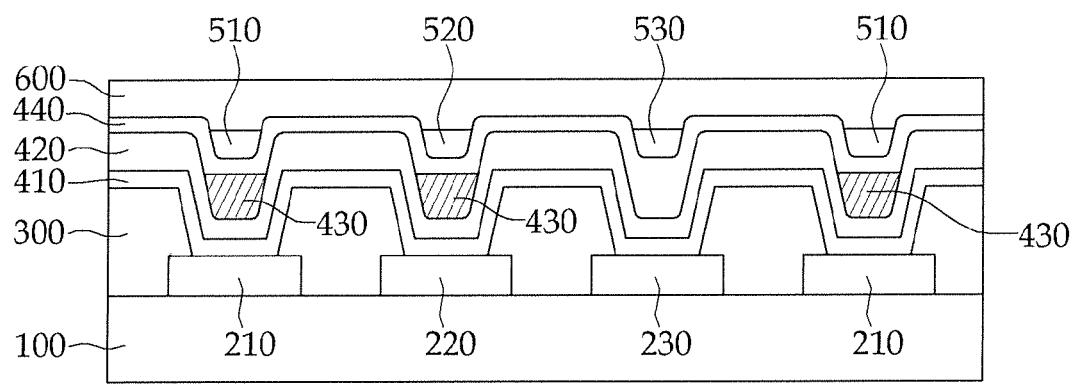
FIG. 5 is a cross-sectional view of an organic light emitting diode display according to another exemplary embodiment of the present disclosure.

Each of the pixels includes a pixel electrode 200, the organic light emitting layer 510, 520, and 530, and the common electrode 600. The pixel electrodes are formed on the substrate and are separated according to the pixels by the pixel defining layer 300. In each of the openings formed by the pixel defining layer 300, any one of the first, second and third pixel electrodes 200 (to be described below) may be disposed. For example, as shown in FIG. 5, a first pixel electrode 210, a second pixel electrode 220, and a third pixel electrode 230 may be disposed in an opening defining the first pixel, an opening defining the second pixel, and an opening defining the third pixel, respectively.

The first, second and third pixel electrodes 210, 220, and 230 are positioned on the substrate 100 and may be made of a reflective conductive material, a transparent conductive material, a translucent conductive material, or the like.

In the case of a bottom emission type device in which an image is implemented in the direction of the substrate 100, the pixel electrode 200 as a first electrode may be a transparent electrode, and the common electrode 600 as a second electrode may be a reflective electrode. In this case, the first electrode may be made of ITO, IZO, ZnO, $In_2O_3$, or the like, which are materials having a high work function, and the second electrode may be made of a metal having a low work function, e.g., Ag, Mg, Al, Pt, Au, Ni, Nd, Ir, Cr, Li, Ca, or the like.

In the case of a top emission type device in which an image is implemented in the direction of the common electrode 600 (i.e., the second electrode), the pixel electrode 200 as a first electrode may be a reflective electrode, and the common electrode 600 as a second electrode may be a transparent electrode. In this case, the reflective electrode (i.e., the pixel electrode 200) may be made by forming a reflective layer with Ag, Mg, Al, Pt, Au, Ni, Nd, Ir, Cr, Li, Ca, a compound thereof, or the like, and then forming ITO, IZO, ZnO, $In_2O_3$, or the like (i.e., a material having a high work function) thereon. The transparent electrode (i.e., the common electrode 600) may be made by depositing a metal having a low work function (e.g., Ag, Mg, Al, Pt, Pd, Au, Ni, Nd, Ir, Cr, Li, Ca, or a compound thereof), and then forming an auxiliary electrode layer or a bus electrode line thereon using a transparent conductive material (such as ITO, IZO, ZnO, $In_2O_3$, or the like).

In the case of a dual emission type device, all of the pixel electrodes 200 (as a first electrode) and the common electrode 600 (as a second electrode) may be formed of a transparent electrode material.

In the following exemplary embodiment, the structure of a top emission type organic light emitting diode display will be described. Therefore, the common electrode 600 according to this exemplary embodiment is made of a material having a light transmitting property.

As shown in FIG. 3, the plurality of pixel electrodes 200 include a first pixel electrode, a second pixel electrode, and a third pixel electrode. The plurality of pixel electrodes 200 may be separated into pixel units by the pixel defining layer 300.

The first light emitting auxiliary layer 400 is formed on the pixel electrodes 200.

As shown in FIGS. 3 and 4, the first light emitting auxiliary layer 400 includes the first doped layer 410, the first buffer layer 420, and the second doped layers 430. Further, the first light emitting auxiliary layer 400 may also include at least one of a hole injection layer and a hole transporting layer.

The first doped layer 410 and the second doped layers 430 are used to improve the interface characteristic between the pixel electrodes 200 and the hole transporting layer. The first doped layer 410 is formed on the pixel electrodes 200 and the second doped layer 430 is formed on the hole transporting layer.

The first doped layer 410 may have a thickness of about 10 to about 200 Å, for example about 20 to about 80 Å, and may be formed on the plurality of pixel electrodes 200 as a common layer. Further, the first doped layer may include a p-doped material and may also be made of the same material as that of the hole injection layer.

When the second doped layer 430 is formed as a common layer like the first doped layer 410, since the hole mobility of the second doped layer 430 is high, the second doped layer 430 serves as a path through which holes move to an adjacent pixel, which may cause leakage current.

Therefore, in the present disclosure, the second doped layers 430 are disposed on at least one of the first pixel electrode, the second pixel electrode, and the third pixel electrode, but are spaced apart from each other. In an exemplary embodiment, as shown in FIGS. 3 and 4, the second doped layers 430 are formed on two of the plurality of pixel electrodes 200, that is, the first pixel electrode and the second pixel electrode.

The first and second doped layers 410 and 430 may include a p-doped material, and p-doped material generally used in the art may be used. For example, the p-doped material may be selected from hexanitrile hexaazatriphenylene, tetrafluoro-tetracyanoquinodimethane ($F_4$-TCNQ), lithium quinolate (LiQ), $FeCl_3$, $F_{16}CuPc$, vanadium oxide ($V_2O_5$), rhenium oxide ($Re_2O_7$), indium tin oxide (ITO), a compound represented by the following Formula 1, and the like.

Formula 1

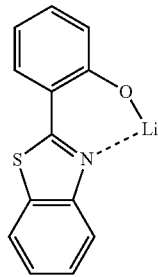

The first buffer layer 420, which is between the first doped layer 410 and the second doped layers 430, may include at least one of a hole injection layer and a hole transporting layer. The first buffer layer 420 also serves to form a space between the first doped layer 410 and the second doped layers 430, and may also have a different thickness for each pixel.

Referring to FIG. 3, the second doped layers 430 are formed on the first buffer layer 420.

In a pixel without the second doped layer 430, an organic light emitting layer is formed directly on the first buffer layer 420. In an exemplary embodiment, in the case of the first pixel and the second pixel, the second doped layers 430 are disposed on the first buffer layer 420, while in the case of the third pixel, a third light emitting layer 530 is disposed directly on the first buffer layer 420 without a second doped layer.

An organic light emitting layer is formed on the first light emitting auxiliary layer 400. The organic light emitting layer includes a first light emitting layer 510, a second light emitting layer 520, and a third light emitting layer 530.

In the first, second and third light emitting layers 510, 520, and 530, holes supplied from the first, second and third pixel electrodes 200 and electrons supplied from the common electrode 600 are combined to form excitons and when the energy level of the excitons changes from the excited state to the ground state, light having a color corresponding to the changed energy level is emitted.

According to an exemplary embodiment, the first light emitting layer 510 includes a material capable of emitting red light, the second light emitting layer 520 includes a material capable of emitting green light, and the third light emitting layer 530 includes a material capable of emitting blue light. In another exemplary embodiment of the present disclosure, the first light emitting layer 510, the second light emitting layer 520, and the third light emitting layer 530 may include materials for emitting green light, blue light, and red light, respectively.

Although not shown, in an exemplary embodiment of the present disclosure, a second light emitting auxiliary layer may be formed between the first, second and third light emitting layers 510, 520, and 530 and the common electrode 600. Here, the second light emitting auxiliary layer may be at least one of an electron transporting layer and an electron injection layer.

The common electrode 600 is formed on the light emitting layer and a potential difference may be generated between the common electrode 600 and the plurality of pixel electrodes 200 due to the electric potential applied to the common electrode 600. Specifically, the common electrode is formed on the first light emitting layer 510, the second light emitting layer 520, and the third light emitting layer 530 as a common layer.

In an exemplary embodiment of the present disclosure, the common electrode 600 may be made of a light transmitting material. In exemplary embodiments, the common electrode 600 may be made of a reflective conductive material, a transparent conductive material, or a translucent conductive material as described in the description for the pixel electrodes 200.

Although not shown, a glass cap may be disposed on the common electrode 600 opposite the substrate 100. The glass cap may further include a sealing member (not shown) for sealing the first, second and third light emitting layers 510, 520, and 530 between the substrate 100 and the glass cap from external air. As the sealing member (not shown), one or more selected from an acryl-based resin, a methacryl-based resin, polyisoprene, a vinyl-based resin, an epoxy-based resin, a urethane-based resin, and a cellulose-based resin may be used.

FIG. 5 is a schematic of a structure of an organic light emitting diode display according to another exemplary embodiment of the present disclosure.

Referring to FIG. 5, the organic light emitting diode display according to another exemplary embodiment of the present disclosure has a structure similar to that shown in the organic light emitting diode displays of FIGS. 3 and 4, but includes a second buffer layer 440.

A first light emitting auxiliary layer 400 according to this exemplary embodiment includes a first doped layer 410, a first buffer layer 420, second doped layers 430, and a second buffer layer 440.

Referring to FIG. 5, the second buffer layer 440 is disposed between the second doped layers 430 and the first and second light emitting layers 510 and 520 in the first and second pixel areas, and is disposed between the first buffer layer 420 and the third light emitting layer 530 in the third pixel area. The second buffer layer 440 may include at least one of a hole injection layer and a hole transporting layer and may be made of a hole injection layer material, a hole transporting layer material, and/or an organic layer material which are known in the art.

Figure 6:
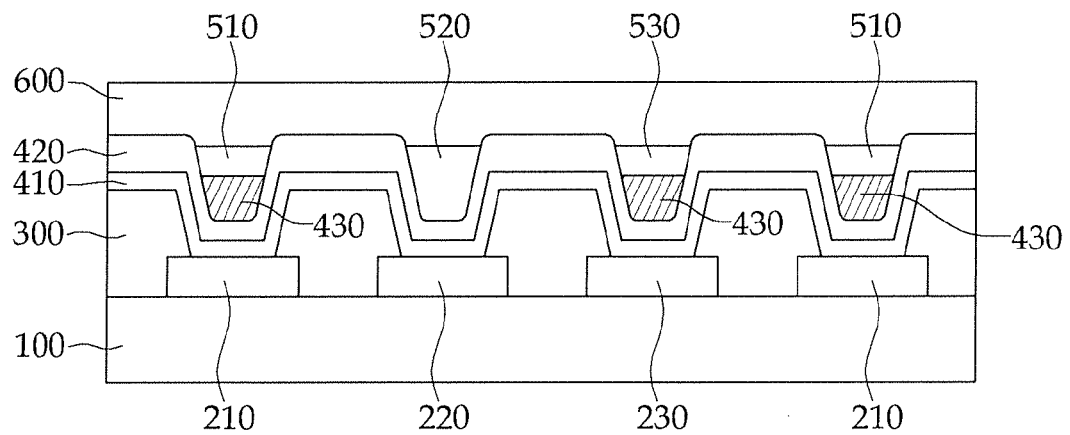
FIG. 6 is a cross-sectional view of an organic light emitting diode display according to another exemplary embodiment of the present disclosure.

FIG. 6 is a cross-sectional view of an organic light emitting diode display according to another exemplary embodiment of the present disclosure.

Referring to FIG. 6, the organic light emitting diode display according to another exemplary embodiment of the present disclosure includes second doped layers 430 formed on two of the first pixel (first pixel electrode 210), the second pixel (second pixel electrode 220), and the third pixel (third pixel electrode 230) in the organic light emitting diode display shown in FIGS. 3 and 4. Specifically, in FIG. 6, the second doped layers 430 are formed on the first pixel electrode 210 and the third pixel electrode 230.

Therefore, in this exemplary embodiment, in the case of the first pixel and the third pixel, the second doped layers 430 are disposed on the first buffer layer 420, while in the case of the second pixel, the light emitting layer 520 is disposed on the first buffer layer 420.

Figure 7:
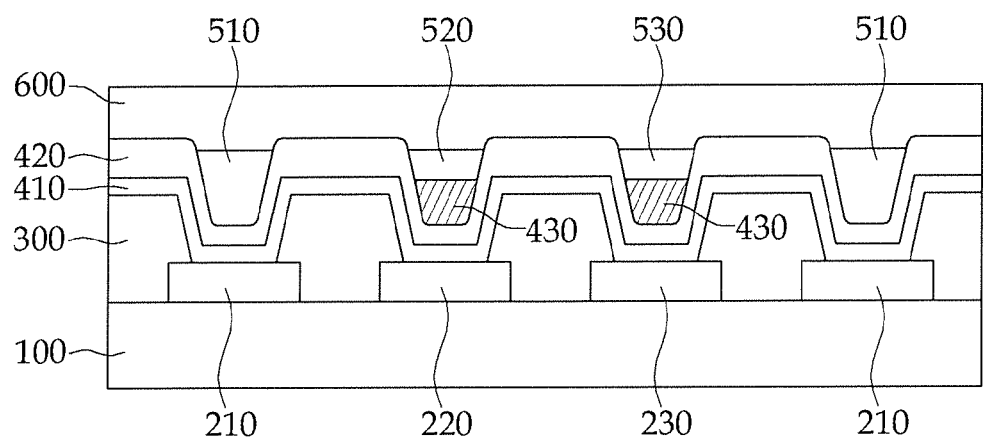
FIG. 7 is a cross-sectional view of an organic light emitting diode display according to another exemplary embodiment of the present disclosure.

FIG. 7 is a cross-sectional view of an organic light emitting diode display according to another exemplary embodiment of the present disclosure.

Referring to FIG. 7, the organic light emitting diode display has a structure in which the second doped layers 430 are formed on the second pixel electrode 220 (second pixel) and the third pixel electrode 230 (third pixel), unlike the organic light emitting diode display shown in FIGS. 3 and 4.

Therefore, in this exemplary embodiment, in the case of the second pixel and the third pixel, the second doped layers 430 are disposed on the first buffer layer 420, while in the case of the first pixel, the light emitting layer 510 is disposed on the first buffer layer 420.

Figure 8:
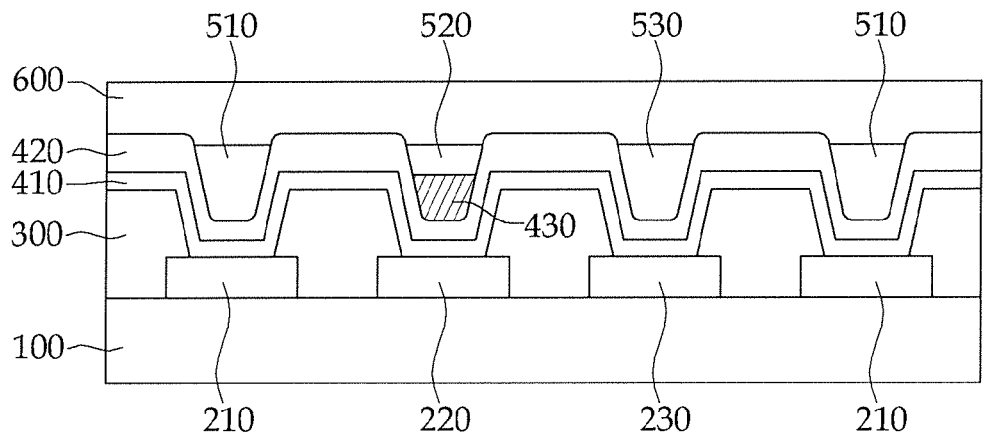
FIG. 8 is a cross-sectional view of an organic light emitting diode display according to another exemplary embodiment of the present disclosure.

FIG. 8 is a cross-sectional view of an organic light emitting diode display according to another exemplary embodiment of the present disclosure.

Referring to FIG. 8, the organic light emitting diode display has a structure in which the second doped layer 430 is formed on only one of the first pixel, the second pixel, and the third pixel (i.e., the second pixel electrode 220 (second pixel)), unlike the organic light emitting diode display shown in FIGS. 3 and 4.

Therefore, in this exemplary embodiment, only in the case of the second pixel, the second doped layer 430 is disposed on the first buffer layer 420, while in the case of the first pixel and the third pixel, the first light emitting layer 510 and the third light emitting layer 530 are disposed on the first buffer layer 420, respectively.

Figure 9:
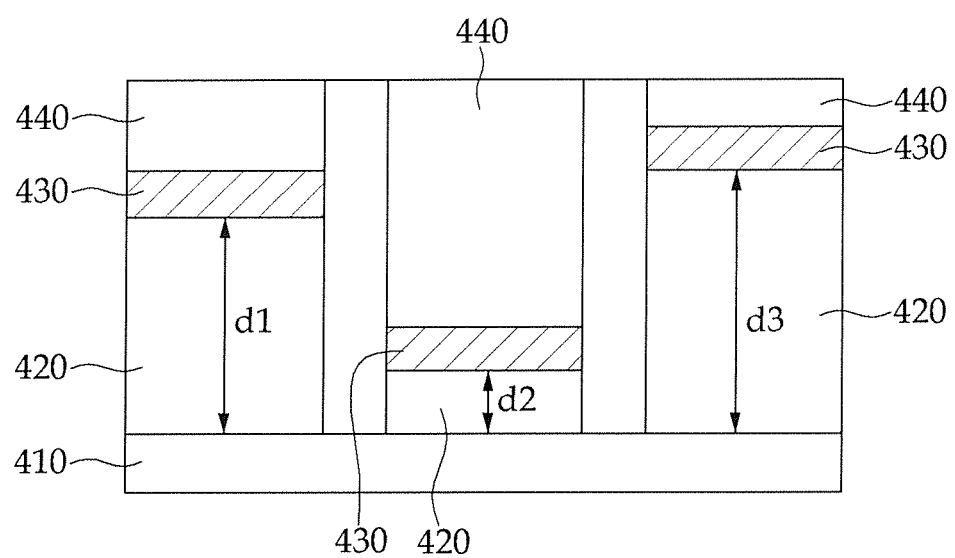
FIG. 9 is a schematic view of the structure of a part corresponding to the first light emitting auxiliary layer in an organic light emitting diode display according to another exemplary embodiment of the present disclosure.

FIG. 9 depicts an organic light emitting diode display according to another exemplary embodiment of the present disclosure, and schematically illustrates the structure of only the part corresponding to the first light emitting auxiliary layer 400.

Referring to FIG. 9, the organic light emitting diode display according to this exemplary embodiment has a structure in which the first light emitting auxiliary layer 400 shown in FIG. 4 includes the second doped layers 430 formed on all of the first pixel electrode 210 (first pixel), the second pixel electrode 220 (second pixel), and the third pixel electrode 230 (third pixel), and the second buffer layer 440 is formed thereon.

In this exemplary embodiment, the second doped layers 430 are formed on all of the first, second and third pixel electrodes 210, 220, and 230. However, in this case, in order to prevent lateral leakage current, the second doped layers 430 are separated from each other according to each pixel.

One method for separating the second doped layers 430 from each other according to each pixel is to form the first buffer layer 420 on the first, second and third pixel electrodes 210, 220, and 230 at different thicknesses. Referring to FIG. 9, a distance d1 from the first doped layer 410 (formed as a common layer) to the second doped layer 430 formed on the first pixel electrode 210, a distance d2 from the first doped layer 410 to the second doped layer 430 formed on the second pixel electrode 220, and a distance d3 from the first doped layer 410 to the second doped layer 430 formed on the third pixel electrode 230 are different from each other. The thickness of the first buffer layer 420 may be adjusted by controlling the deposition rate, and even though the second doped layers 430 are formed on the front surface, the second doped layers 430 may be separated.

As described above, since the second doped layer 430 may be disposed on at least one of the first pixel electrode 210, the second pixel electrode 220, and the third pixel electrode 230, various different exemplary configurations may be made. As such, the scope of the present disclosure is not limited to the above-described embodiments.

The following examples are presented for illustrative purposes only and do not limit the scope and content of the present disclosure.

An experiment was performed to verify whether the organic light emitting diode display according to the present disclosure prevents leakage current and improves displaying grays.

The organic light emitting diode display shown in FIG. 1 (in which the intermediate p-doped layer is formed as a common layer) was used as a control (i.e., Comparative Example). The organic light emitting diode displays according to exemplary embodiments in which the second doped layers are formed on only the first and second pixels, in which the second doped layer is formed on only the second pixel, and in which the second doped layers are formed on all of the first to third pixels but the thickness of the first buffer layer of each of the pixels is different, were used as Experimental Examples 1, 2, and 3, respectively. In each of the Comparative Example and Experimental Examples 1, 2 and 3, it was observed whether a stain occurred or not and whether colors were mixed or not.

After performing the experiment, in Experimental Examples 1, 2, and 3, a stain was hardly observed and a color mixing phenomenon was not observed in low grays. On the other hand, in the Comparative Example, a black stain was observed and the color mixing phenomenon occurred in low grays. Consequently, it was verified that in the organic light emitting diode displays according to the present disclosure, the occurrence of stain and the color mixing phenomenon in low grays due to leakage current were substantially prevented.

While various exemplary embodiments of the present disclosure have been described, the present disclosure is not limited to the described embodiments as it is understood that various modifications may be made to the described embodiments without departing from the scope and spirit of the present disclosure, as indicated by the following claims.

What is claimed is:

1. An organic light emitting diode display, comprising:
   a substrate;
   a plurality of pixel electrodes comprising first, second and third pixel electrodes on the substrate;
   a first light emitting auxiliary layer on the pixel electrodes, the first light emitting auxiliary layer comprising:
   a first common doped layer on the first, second and third pixel electrodes, a first buffer layer, and
at least one second doped layer on at least one of the first pixel electrode, the second pixel electrode, and the third pixel electrode, wherein when the at least one second doped layer comprises a plurality of second doped layers on more than one of the first, second and third pixel electrodes, the plurality of second doped layers are spaced apart from each other;
an organic light emitting layer on the first light emitting auxiliary layer, the organic light emitting layer including a first light emitting layer, a second light emitting layer, and a third light emitting layer; and
a common electrode on the organic light emitting layer.

2. The organic light emitting diode display of claim 1, wherein the first light emitting auxiliary layer includes at least one of a hole injection layer and a hole transporting layer.

3. The organic light emitting diode display of claim 1, wherein the first buffer layer includes at least one of a hole injection layer and a hole transporting layer.

4. The organic light emitting diode display of claim 1, further comprising:
a second light emitting auxiliary layer between the organic light emitting layer and the common electrode.

5. The organic light emitting diode display of claim 4, wherein the second light emitting auxiliary layer includes at least one of an electron transporting layer and an electron injection layer.

6. The organic light emitting diode display of claim 1, further comprising:
a second buffer layer between the second doped layers and the organic light emitting layer.

7. The organic light emitting diode display of claim 6, wherein the second buffer layer includes at least one of a hole injection layer and a hole transporting layer.

8. The organic light emitting diode display of claim 1, wherein the second doped layers are disposed on the first pixel electrode, the second pixel electrode, and the third pixel electrode.

9. The organic light emitting diode display of claim 8, wherein a height of the first buffer layer on the first pixel electrode, a height of the first buffer layer on the second pixel electrode, and a height of the first buffer layer on the third pixel electrode are different from each other.

10. The organic light emitting diode display of claim 1, wherein the second doped layers are formed on two of the first pixel electrode, the second pixel electrode, and the third pixel electrode.

11. The organic light emitting diode display of claim 10, wherein distances between the first doped layer and the second doped layers are different from each other.

12. The organic light emitting diode display of claim 1, wherein the second doped layer is on one of the first pixel electrode, the second pixel electrode, and the third pixel electrode.

13. The organic light emitting diode display of claim 1, wherein each of the first light emitting layer, the second light emitting layer, and the third light emitting layer is any one of a red light emitting layer, a green light emitting layer, and a blue light emitting layer.

14. The organic light emitting diode display of claim 1, wherein the first doped layer includes a p-doped material.

15. The organic light emitting diode display of claim 1, wherein a thickness of the first doped layer is about 10 to about 200 Å.

16. The organic light emitting diode display of claim 1, wherein the second doped layer includes a p-doped material.

17. The organic light emitting diode display of claim 1, wherein the second doped layer includes at least one of hexanitrile hexaazatriphenylene, tetrafluoro-tetracyanoquinodimethane (F$_4$-TCNQ), lithium quinolate (LiQ), FeCl$_3$, F$_{16}$CuPc, a compound represented by the following Formula 1, or a metal oxide:

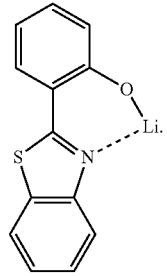

Formula 1

18. The organic light emitting diode display of claim 17, wherein the second doped layer includes a metal oxide selected from vanadium oxide (V$_2$O$_5$), rhenium oxide (Re$_2$O$_7$), and indium tin oxide (ITO).

19. The organic light emitting diode display of claim 1, wherein a thickness of the second doped layer is about 10 to about 200 Å.

20. The organic light emitting diode display of claim 1, wherein a thickness of the second doped layer is about 20 to about 80 Å.

21. The organic light emitting diode display of claim 1, wherein the plurality of pixel electrodes are divided into pixel units by a pixel defining layer.

22. The organic light emitting diode display of claim 1, wherein the pixel electrodes define a positive electrode and the common electrode is a negative electrode.

23. The organic light emitting diode display of claim 1, wherein the common electrode has a light transmitting property.

24. A method for manufacturing an organic light emitting diode display, comprising: forming a plurality of pixel electrodes on a substrate comprising forming a first pixel electrode, a second pixel electrode, and a third pixel electrode;
forming a first light emitting auxiliary layer on the pixel electrodes comprising forming a first common doped layer on the first, second and third pixel electrodes, forming a first buffer layer, and forming at least one second doped layer, wherein the at least one second doped layer is formed on at least one of the first pixel electrode, the second pixel electrode, and the third pixel electrode and when the at least one second doped layer is formed on more than one of the first, second and third pixel electrodes, the second doped layers are spaced apart from each other;
forming an organic light emitting layer on the first light emitting auxiliary layer comprising forming a first light emitting layer, forming a second light emitting layer, and forming a third light emitting layer; and
forming a common electrode on the organic light emitting layer.

25. The method of claim 24, wherein the forming of the first light emitting auxiliary layer includes at least one of forming a hole injection layer and forming a hole transporting layer.

26. The method of claim 24, wherein the forming of the first buffer layer includes at least one of forming a hole injection layer and forming a hole transporting layer.

27. The method of claim 24, further comprising:
forming a second light emitting auxiliary layer between the organic light emitting layer and the common electrode.

28. The method of claim 27, wherein the forming of the second light emitting auxiliary layer includes at least one of forming an electron transporting layer and forming an electron injection layer.

29. The method of claim 27, further comprising:
forming a second buffer layer between the second doped layer and the organic light emitting layer.

30. The method of claim 29, wherein the forming of the second buffer layer includes at least one of forming a hole injection layer and forming a hole transporting layer.

31. The method of claim 24, wherein the second doped layers are formed on the first pixel electrode, the second pixel electrode, and the third pixel electrode.

32. The method of claim 24, wherein a height of the first buffer layer formed on the first pixel electrode, a height of the first buffer layer formed on the second pixel electrode, and a height of the first buffer layer formed on the third pixel electrode are different from each other.

33. The method of claim 24, wherein the second doped layers are formed on two of the first pixel electrode, the second pixel electrode, and the third pixel electrode.

34. The organic light emitting diode display of claim 33, wherein distances between the first doped layer and the second doped layers are different from each other.

35. The method of claim 24, wherein the second doped layer is formed on one of the first pixel electrode, the second pixel electrode, and the third pixel electrode.

36. The method of claim 24, wherein each of the first light emitting layer, the second light emitting layer, and the third light emitting layer is any one of a red light emitting layer, a green light emitting layer, and a blue light emitting layer.

37. The method of claim 24, wherein the first doped layer includes a p-doped material.

38. The method of claim 24, wherein a thickness of the first doped layer is about 10 to about 200 Å.

39. The method of claim 24, wherein the second doped layer includes a p-doped material.

40. The method of claim 24, wherein the second doped layer includes at least one of hexanitrile hexaazatriphenylene, tetrafluoro-tetracyanoquinodimethane ($F_4$-TCNQ), lithium quinolate (LiQ), $FeCl_3$, $F_{16}CuPc$, a compound represented by the following Formula 1, or a metal oxide:

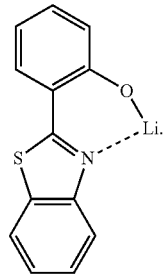

Formula 1

41. The method of claim 40, wherein the second doped layer comprises a metal oxide selected from vanadium oxide ($V_2O_5$), rhenium oxide ($Re_2O_7$), and indium tin oxide (ITO).

42. The method of claim 24, wherein a thickness of the second doped layer is about 10 to about 200 Å.

43. The method of claim 24, wherein a thickness of the second doped layer is about 20 to about 80 Å.

44. The method of claim 24, wherein the plurality of pixel electrodes are divided into pixel units by a pixel defining layer.

45. The method of claim 24, wherein the pixel electrodes define a positive electrode and the common electrode is a negative electrode.

46. The method of claim 24, wherein the common electrode has a light transmitting property.

* * * * *